(12) United States Patent
Nakajima

(10) Patent No.: US 10,784,217 B2
(45) Date of Patent: Sep. 22, 2020

(54) MEMORY DEVICE

(71) Applicant: TOSHIBA MEMORY CORPORATION, Tokyo (JP)

(72) Inventor: Hiroomi Nakajima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/906,760

(22) Filed: Feb. 27, 2018

(65) Prior Publication Data

US 2019/0081017 A1 Mar. 14, 2019

(30) Foreign Application Priority Data

Sep. 8, 2017 (JP) ................ P2017-173296

(51) Int. Cl.
| | |
|---|---|
| *H01L 23/00* | (2006.01) |
| *H01L 27/1157* | (2017.01) |
| *H01L 27/11582* | (2017.01) |
| *H01L 27/11573* | (2017.01) |
| *H01L 23/535* | (2006.01) |
| *H01L 27/11575* | (2017.01) |

(52) U.S. Cl.
CPC ............ *H01L 24/05* (2013.01); *H01L 23/535* (2013.01); *H01L 23/562* (2013.01); *H01L 24/45* (2013.01); *H01L 27/1157* (2013.01); *H01L 27/11573* (2013.01); *H01L 27/11582* (2013.01); *H01L 27/11575* (2013.01); *H01L 2224/04042* (2013.01); *H01L 2224/05025* (2013.01); *H01L 2224/4502* (2013.01)

(58) Field of Classification Search
None
See application file for complete search history.

(56) References Cited

U.S. PATENT DOCUMENTS

| | | | |
|---|---|---|---|
| 9,035,371 B2 | 5/2015 | Nakajima | |
| 9,558,945 B2 | 1/2017 | Fukuzumi et al. | |
| 10,090,315 B2 | 10/2018 | Fukuzumi et al. | |
| 10,403,635 B2 | 9/2019 | Fukuzumi et al. | |
| 2016/0307910 A1* | 10/2016 | Son | ...................... H01L 27/0688 |
| 2017/0047345 A1 | 2/2017 | Lee et al. | |

FOREIGN PATENT DOCUMENTS

| | | |
|---|---|---|
| CN | 110880517 A | 3/2020 |
| JP | 2016062901 A | 4/2016 |

* cited by examiner

*Primary Examiner* — Long Pham
(74) *Attorney, Agent, or Firm* — Kim & Stewart LLP

(57) ABSTRACT

A memory device includes a circuit having an element on a substrate, an interconnection layer above the circuit and that includes a pad electrode having a region for metal wiring bonding, a plurality of electrode layers between the circuit and the interconnection layer and that are stacked in a first direction from the circuit to the interconnection layer, a semiconductor pillar that extends in the first direction, and a storage film between the electrode layers and the semiconductor pillar. The pad electrode overlaps the circuit element as viewed in the first direction.

20 Claims, 6 Drawing Sheets

FIG. 3A    FIG. 3B    FIG. 3C
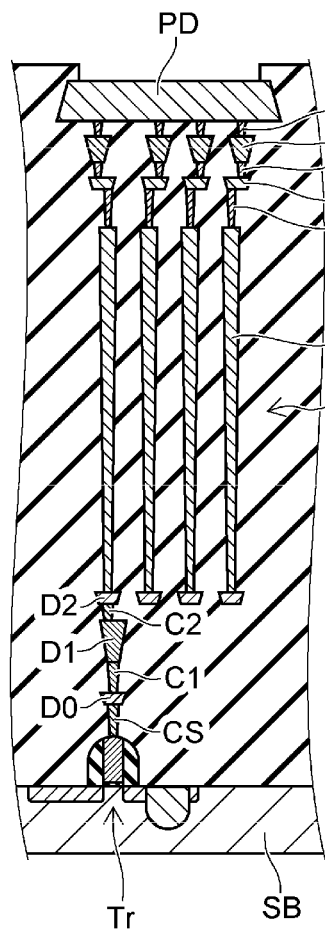
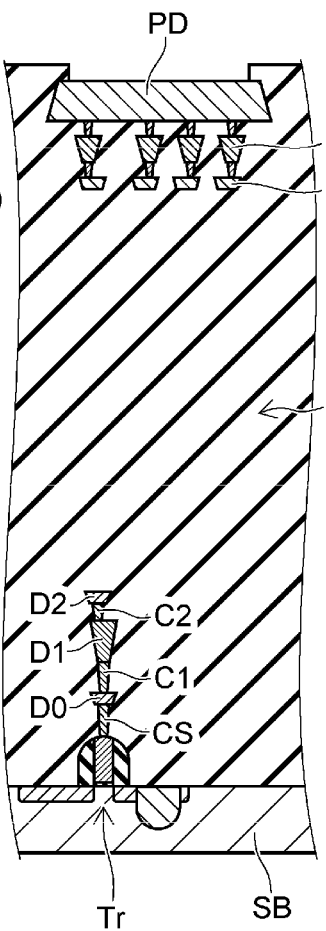
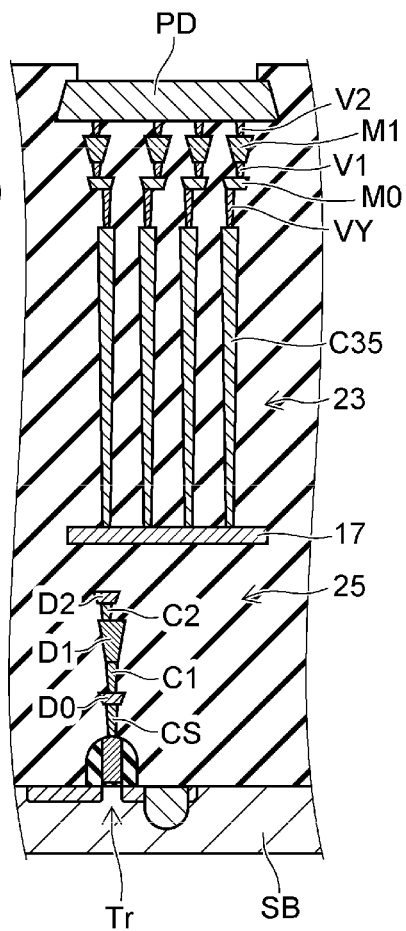
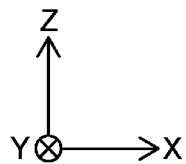
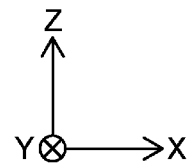
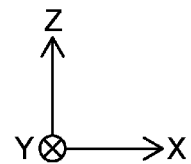

MEMORY DEVICE

CROSS-REFERENCE TO RELATED APPLICATION

This application is based upon and claims the benefit of priority from Japanese Patent Application No. 2017-173296, filed Sep. 8, 2017, the entire contents of which are incorporated herein by reference.

FIELD

Embodiments described herein relate generally to a memory device.

BACKGROUND

A pad electrode is provided on a chip surface of a memory device. A metal wire is bonded onto the pad electrode to connect the memory device to an external circuit. In general, the pad electrode placement avoids circuit elements such as transistors and thus prevents impact faults caused by wire bonding. Nevertheless, as memory capacity increases, it is desirable to make more effective use of the available chip area below the pad electrode.

DESCRIPTION OF THE DRAWINGS

FIGS. 3A, 3B, and 3C are schematic cross-sectional views showing pad electrodes according to various modifications of a first embodiment.

DETAILED DESCRIPTION

Figure 1:
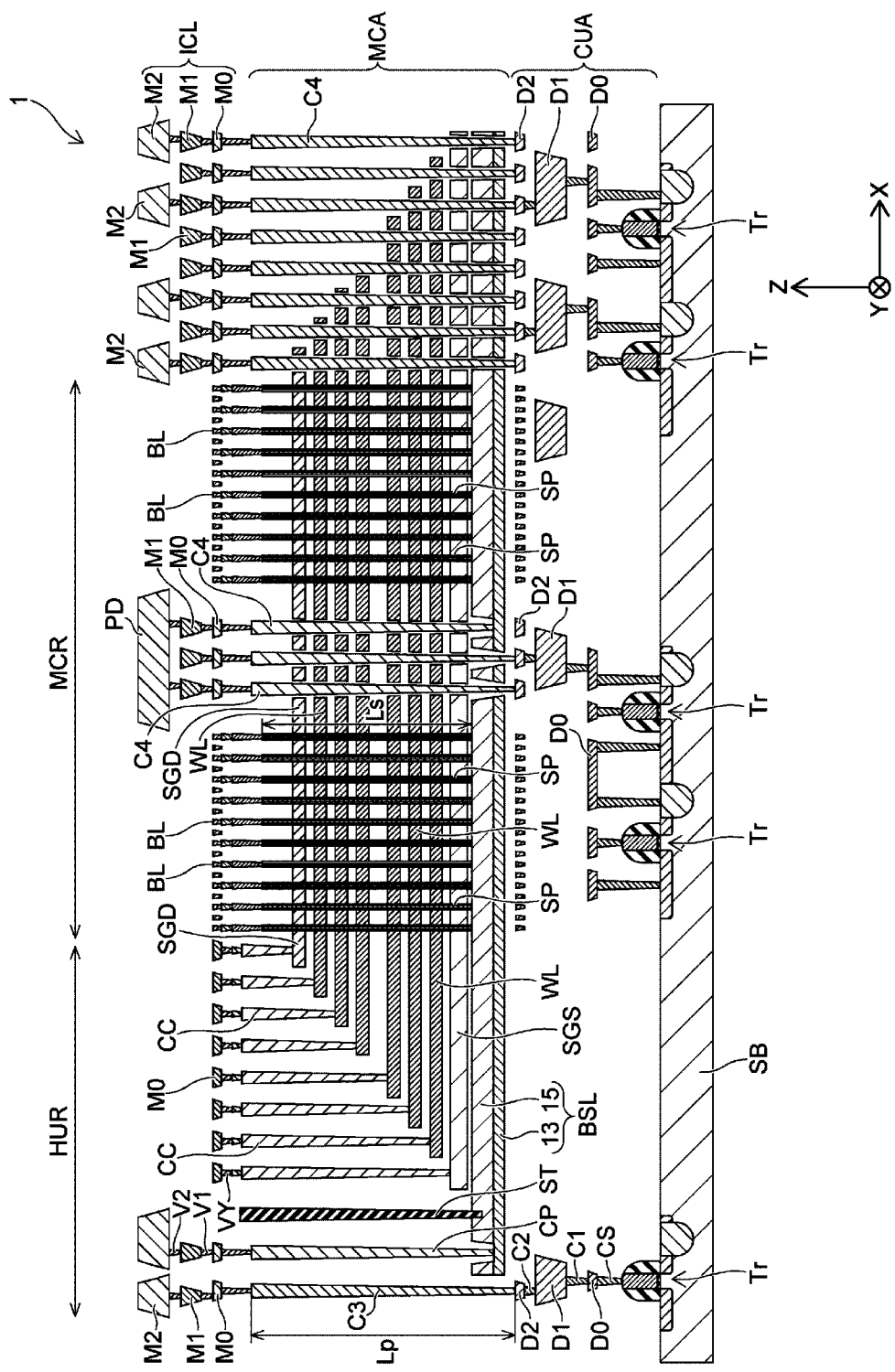
FIG. 1 is a schematic cross-sectional view showing a memory device according to a first embodiment.

In general, according to one embodiment, a memory device includes a circuit with a first circuit element on a substrate, an interconnection layer above the circuit and that includes a pad electrode having a region where a metal wiring can be bonded. A plurality of electrode layers are between the circuit and the interconnection layer and stacked with interlayer insulating films in a first direction from the circuit to the interconnection layer, a semiconductor pillar that extends in the first direction, and a storage film between the plurality of electrode layers and the semiconductor pillar. The pad electrode overlaps the circuit element as viewed in the first direction.

Example embodiments will be described hereinafter with reference to the drawings. In the drawings, the same aspects are denoted by the same reference numerals and detailed description of the repeated aspects may be omitted as appropriate, while differences will be described. The drawings are schematic or conceptual and the relationship between depicted dimensions and dimensional ratios of different aspects are not necessarily identical those in actual devices. Furthermore, when same aspects are illustrated in different drawings they may be depicted with different sizes or different proportions in the different the drawings.

Layout and a configuration of each section will be described using an X-axis, a Y-axis, and a Z-axis shown in the drawings. The X-axis, the Y-axis, and the Z-axis are orthogonal to one another and represent an X direction, a Y direction, and a Z direction, respectively. In addition, description is often given while assuming that one direction along the Z-axis is an upward direction and an opposite direction thereto is a lower direction.

First Embodiment

FIG. 1 is a schematic cross-sectional view showing a memory device 1 according to a first embodiment. The memory device 1 is, for example, a NAND flash memory device, and includes a memory cell array MCA that includes memory cells disposed three-dimensionally and a drive circuit CUA. The memory cell array MCA is provided above the drive circuit CUA. For purposes of explanation, FIG. 1 does not show insulating films that electrically isolate elements from one another.

The drive circuit CUA includes a plurality of circuit elements, for example, transistors Tr provided on a substrate SB. The drive circuit CUA further includes interconnections D0, D1, and D2 and contact plugs CS, C1, and C2 located between the substrate SB and the memory cell array MCA. The contact plugs CS, C1, and C2 electrically connect one transistor Tr to an interconnection D0, an interconnection D0 to an interconnection D1, and an interconnection D1 to an interconnection D2, respectively.

The memory cell array MCA is provided on the drive circuit CUA, and has a memory cell region MCR and a lead region HUR. The memory cell region MCR includes a plurality of memory cells disposed three-dimensionally. The memory cell array MCA includes a source line BSL, word lines WL, a select gate SGS, select gates SGD, and semiconductor pillars SP. The source line BSL has a structure in which a metal layer 13 and a semiconductor layer 15 are stacked in the Z direction. The select gate SGS, the word lines WL, and the select gates SGD are stacked in this order on the source line BSL via interlayer insulating films (not shown).

As shown in FIG. 1, the semiconductor pillars SP are disposed in the memory cell region MCR, and penetrate the select gate SGS, the word lines WL, and the select gates SGD to extend in the Z direction. The memory cells are provided in portions where the semiconductor pillars SP intersect the word lines WL, respectively. A lower end of each of the semiconductor pillars SP is connected to the source line BSL.

The memory device 1 further includes an interconnection layer ICL provided above the memory cell array MCA. The interconnection layer ICL includes interconnections M0, M1, and M2. One interconnection M0 is connected to one interconnection M1 by a contact plug V1, and the interconnection M1 is connected to one interconnection M2 by a contact plug V2. Furthermore, contact plugs VY, each connecting one interconnection M0 to the contact plug or the like located below the interconnection M0, are provided.

The interconnections M0 each include a bit line BL electrically connected to an upper end of one semiconductor pillar SP. The bit lines BL are provided above the memory cell region MCR and extend, for example, in the Y direction. The bit lines BL are each connected to the upper end of the semiconductor pillar SP via, for example, one contact plug VY.

The select gate SGS, the word lines WL, and the select gates SGD are located in the lead region HUR and have end portions formed in a stepped configuration. A plurality of contact plugs CC are provided in the lead region HUR, and are connected to end portions of the select gates SGS, the word lines WL, or the select gates SGD. The contact plugs CC electrically connect the select gate SGS, the word lines WL, and the select gates SGD to the interconnections M0.

The memory device 1 further includes contact plugs C3 and C4. The contact plug C3 electrically connects one interconnection D2 of the drive circuit CUA to one interconnection M0. The contact plugs C4 each penetrate the memory cell array MCA and electrically connect one interconnection D2 of the drive circuit CUA to one interconnection M0.

In the memory device 1, the interconnection layer ICL provided above the memory cell array MCA is electrically connected to the memory cell array MCA and the drive circuit CUA via the contact plugs C3 and C4. Furthermore, the interconnection layer ICL includes a pad electrode PD for electrically connecting an external circuit to the drive circuit CUA. The pad electrode PD is disposed above at least one of the transistors Tr of the drive circuit CUA and has a region capable of, for example, being bonded to a metal wire.

In an example shown in FIG. 1, the pad electrode PD is disposed on the contact plugs C4, which penetrate the select gates SGD, the word lines WL, the select gate SGS, and the source line BSL, and are connected to one interconnection D2 of the drive circuit CUA. The pad electrode PD is also provided on the interconnections M0 and M1. That is, the pad electrode PD is provided at the same level as that of the interconnections M2 located on an uppermost layer. Furthermore, the pad electrode PD is disposed in a device region where the semiconductor pillars SP are not provided.

By disposing a plurality of electrode layers stacked via the interlayer insulating films below the pad electrode PD it is possible to mitigate impact forces during, for example, a metal wire bonding process. Owing to this, it is possible to dispose circuit elements, such as the transistors Tr, below the pad electrode PD. This enables an effective use of the chip surface of the memory device 1 and permits an increase in a memory capacity or storage density.

Figure 2:
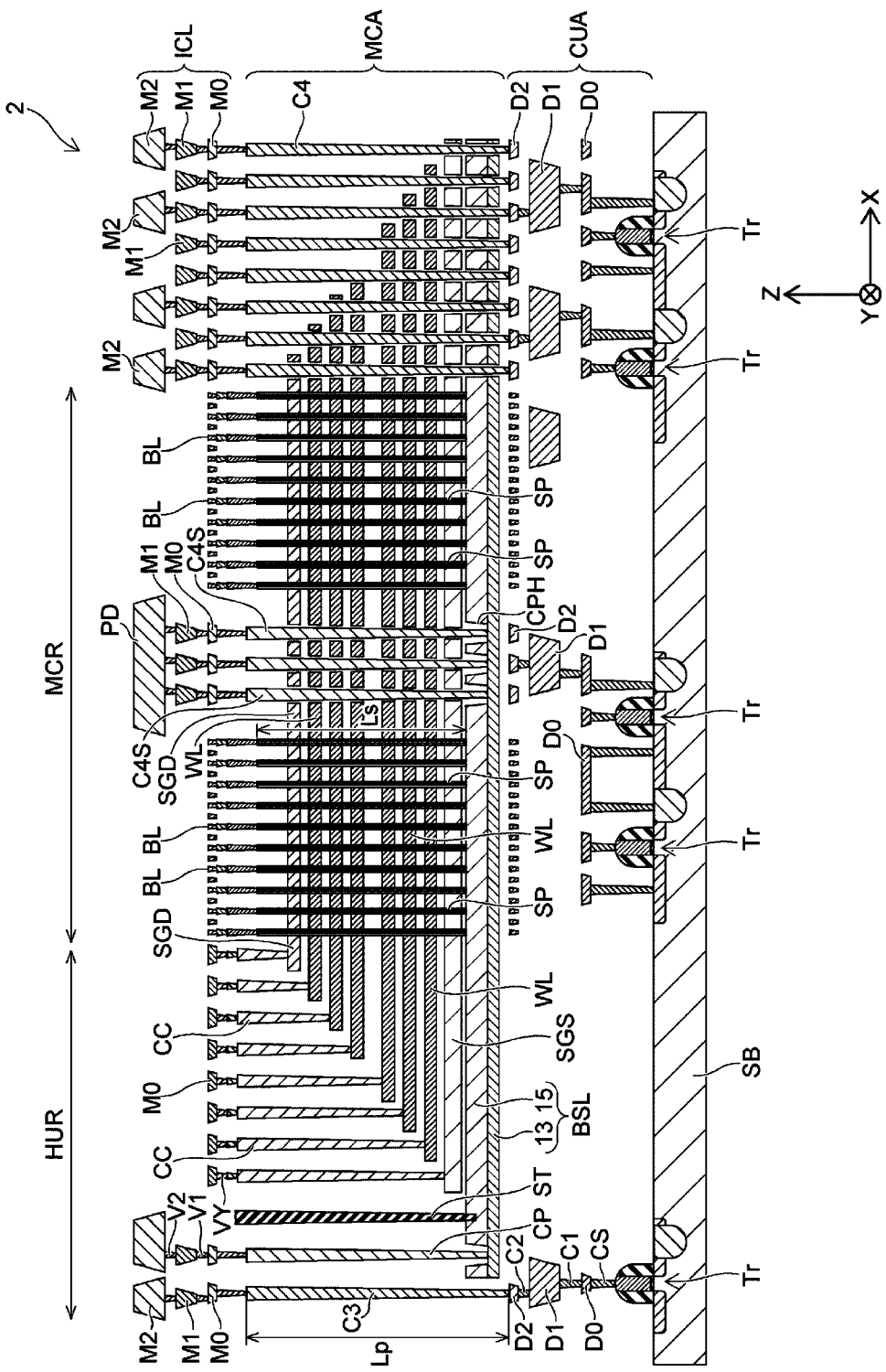
FIG. 2 is a schematic cross-sectional view showing a memory device according to a modification of the first embodiment.

FIG. 2 is a schematic cross-sectional view showing a memory device 2 according to a modification of the first embodiment. In this example, the pad electrode PD is disposed on contact plugs C4S.

The contact plugs C4S penetrate the select gates SGD, the word lines WL, and the select gate SGS, and are connected to the source line BSL. The contact plugs C4S penetrate the semiconductor layer 15 of the source line BSL and are connected to the metal layer 13. The contact plugs C4S each electrically connect the source line BSL to one interconnection M0 via one contact plug VY.

In this example, similarly to the first embodiment, disposing a plurality of electrode layers stacked via the interlayer insulating films below the pad electrode PD mitigates an impact force that occurs during wire bonding, and permits circuit elements to be disposed below the pad electrode PD.

FIGS. 3A to 3C are schematic cross-sectional views each showing the pad electrode PD according to a modification of the first embodiment. As shown in FIGS. 3A to 3C, the pad electrode PD may be disposed in a portion where the select gate SGS, the word lines WL, and the select gates SGD are not provided.

As shown in FIG. 3A, the pad electrode PD may be disposed on the contact plugs C3. The transistor Tr of the drive circuit CUA is disposed below the pad electrode PD. The contact plug C3 electrically connects one interconnection M0 to one interconnection D2 of the drive circuit CUA.

The contact plugs C3 each penetrate an insulator 20 provided between the interconnections M0 and D2 and extend in the Z direction. A length Lp of each contact plug C3 in the Z direction is larger than a length Ls of each semiconductor pillar SP in the Z direction (see FIGS. 1 and 2). The insulator 20 is, for example, silicon oxide.

As shown in FIG. 3B, the pad electrode PD may be disposed above the transistor Tr of the drive circuit CUA via the insulator 20. The insulator 20 has a thickness in the Z direction larger than the length Ls of each semiconductor pillar SP in the Z direction.

As shown in FIG. 3C, the pad electrode PD may be disposed on contact plugs C3S. The transistor Tr of the drive circuit CUA is disposed below the pad electrode PD. The contact plugs C3S electrically connect the interconnections M0 to a semiconductor layer 17. The semiconductor layer 17 is, for example, part of the select gate SGS.

An insulator 23 is provided between the semiconductor layer 17 and the interconnections M0. In addition, an insulator 25 is provided between the semiconductor layer 17 and the interconnection D2 of the drive circuit CUA. The insulators 23 and 25 are, for example, silicon oxide.

The contact plugs C3S penetrate the insulator 23 and extend in the Z direction. A total thickness that is a sum a thickness of the insulator 23 in the Z direction and a thickness of the insulator 25 in the Z direction is larger than the length Ls of each semiconductor pillar SP in the Z direction.

In this way, by providing the insulators having the thickness larger than the length of each semiconductor pillar SP in the Z direction between the pad electrode PD and the circuit element, it is possible to mitigate an impact during wire bonding. It is thereby possible to avoid breakdown of the circuit element due to the wire bonding. Furthermore, the pad electrode PD has a region exposed from the insulators to enable the wire bonding.

Figure 4:
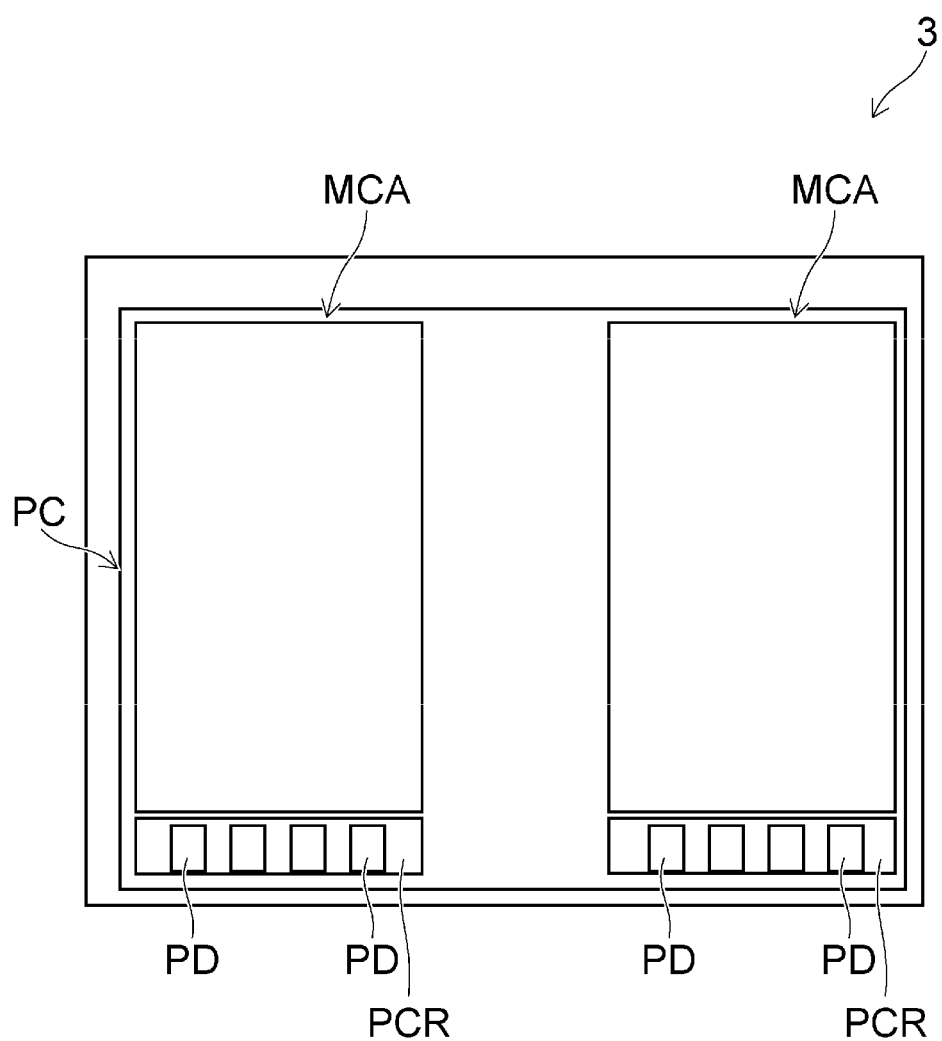
FIG. 4 is a schematic plan view showing layout of pad electrodes according to a first embodiment.
Figure 5:
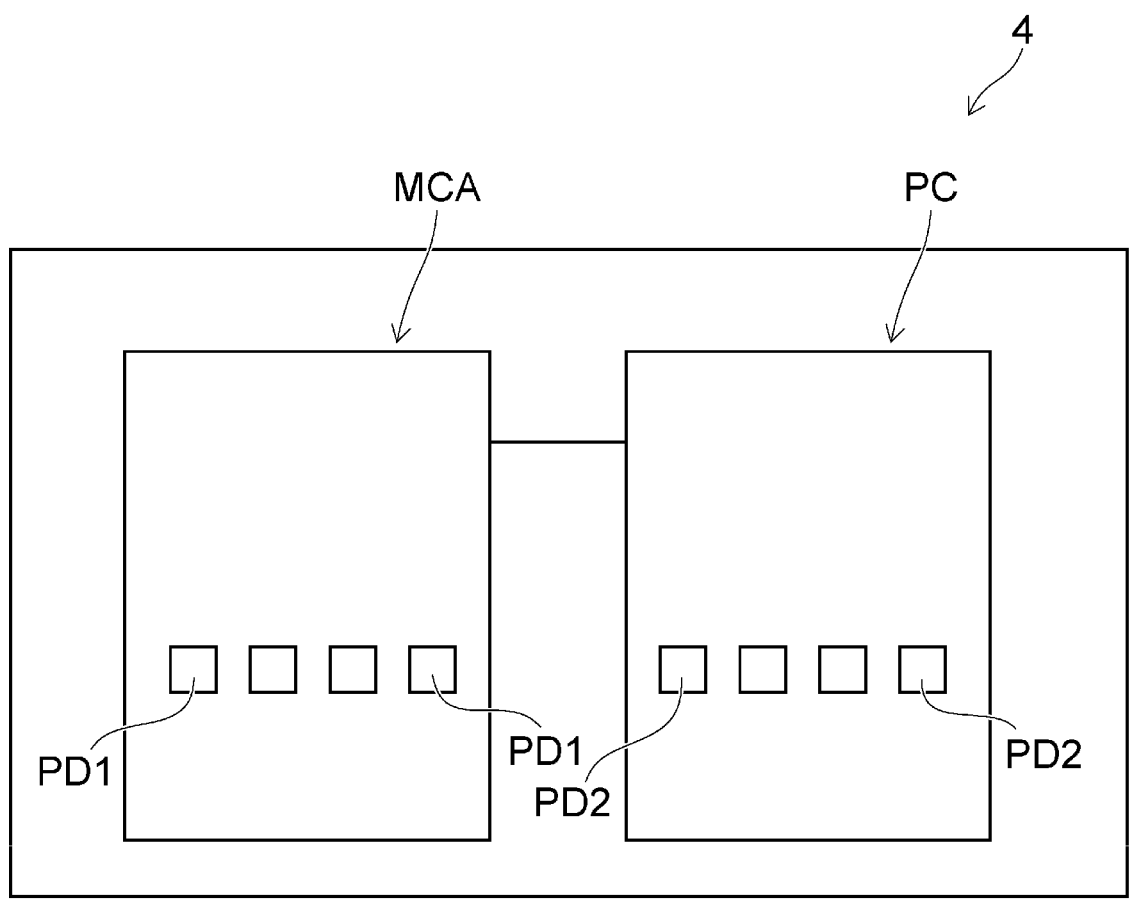
FIG. 5 is a schematic plan view showing layout of pad electrodes according to a modification of a first embodiment.

FIGS. 4 and 5 are schematic plan views each showing layout of the pad electrodes according to the first embodiment. A memory device 3 shown in FIG. 4 has a plurality of memory cell arrays MCA disposed on a chip surface thereof. A memory device 4 shown in FIG. 5 has the memory cell array MCA and a peripheral circuit PC disposed on a chip surface thereof.

As shown in FIG. 4, a peripheral circuit PC is provided on the chip surface around the memory cell arrays MCA. In this example, the pad electrodes PD are disposed on peripheral regions PCR (see FIGS. 3A to 3C).

The peripheral regions PCR are, for example, a logic region that includes a ROM (Read Only Memory), a power supply region that includes a pump circuit and the like, a sense amplifier, and a decoder, and the pad electrodes PD may be disposed above the peripheral circuit regions PCR. That is, the pad electrodes PD may be disposed above circuit elements in the peripheral circuit PC other than the drive circuit CUA.

As shown in FIG. 5, the memory device 4 includes pad electrodes PD1 (see FIGS. 1 and 2) disposed on the memory cell array MCA and pad electrodes PD2 (see FIGS. 3A to 3C) disposed on the peripheral circuit PC. The pad electrodes PD1 are disposed on the drive circuit CUA via the memory cell array MCA. The pad electrodes PD2 are disposed on the peripheral circuit PC that includes a power supply unit and a logic unit.

The examples are not limited to the examples shown in FIGS. 4 and 5 and the pad electrodes PD may, in general, be disposed anywhere on the chip surface of the memory device. In other words, the circuit elements may also be disposed in any location in the chip surface and a space on the chip surface can be effectively used.

Second Embodiment

Figure 6A:
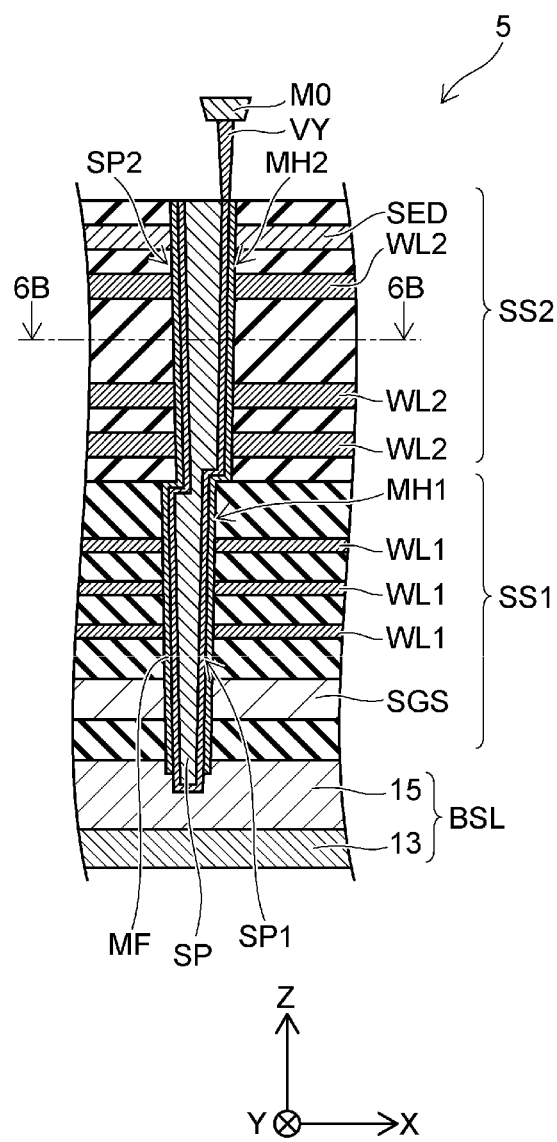
FIGS. 6A and 6B are partial cross-sectional views schematically showing a memory device according to a second embodiment.
Figure 6B:
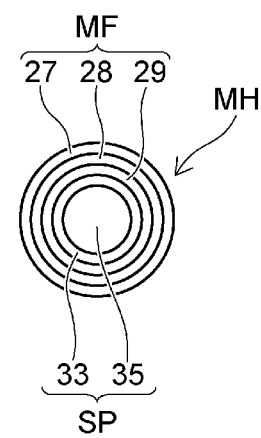

FIGS. 6A and 6B are partial cross-sectional views schematically showing a memory device 5 according to a second embodiment. FIG. 6A is a schematic diagram showing cross-sections of the select gate SGS, the word lines WL, and the select gate SGD stacked on the source line BSL. FIG. 6B is a schematic diagram showing a cross-section taken along a line 6B-6B shown in FIG. 6A.

As shown in FIG. 6A, the memory device 5 includes a first stacked body SS1 provided on the source line BSL and a second stacked body SS2. The second stacked body SS2 is provided on the first stacked body SS1. The first stacked body SS1 includes the select gate SGS and a plurality of word lines WL1. The second stacked body SS2 includes a plurality of word lines WL2 and the select gate SGD.

For example, when the number of word lines WL increases, it becomes more difficult to form a memory hole MH that penetrates the select gate SGD, the word lines WL, and the select gate SGS to reach the source line BSL. In such a case, a first stacked body SS1 is formed on the source line BSL, and a memory hole MH1 that penetrates the first stacked body SS1 to reach the source line BSL is formed. A second stacked body SS2 is then formed on the first stacked body SS1, and a memory hole MH2 that penetrates the second stacked body SS2 to reach the memory hole MH1 is formed. This can facilitate forming a memory hole MH that penetrates many word lines WL.

As shown in FIG. 6A, a memory film MF and the semiconductor pillar SP are provided within the memory holes MH1 and MH2. The memory film MF extends in the Z direction along inner surfaces of the memory holes MH1 and MH2. The semiconductor pillar SP is provided within the memory holes MH1 and MH2 provided with the memory film MF. The semiconductor pillar SP includes a first pillar SP1 that penetrates the first stacked body SS1 and a second pillar SP2 that penetrates the second stacked body SS2.

As shown in FIG. 6B, the memory film MF has a structure in which a first film 27, a second film 28, and a third film 29 are layered. The first film 27 and the third film 29 are, for example, silicon oxide films, while the second film 28 is, for example, a silicon nitride film.

The first film 27 functions as a block insulating film, the second film 28 functions as a charge retention film, and the third film 29 functions as a tunnel insulating film between each word line WL and the semiconductor pillar PS (see FIG. 6A). That is, the memory film MF has a function of trapping electric charges and functions as a storage unit of a memory cell in portions located between each word line WL and the semiconductor pillar SP.

The semiconductor pillar SP includes, for example, a semiconductor film 33 and an insulating core 35. The insulating core 35 extends in the Z direction within the memory holes MH1 and MH2. The semiconductor film 33 surrounds the insulating core 35. It is noted that the memory film MF and the semiconductor pillar SP are configured similarly in the first embodiment.

The memory device 5 has a structure in which many word lines WL are stacked for increasing storage capacity. This is an increased thickness structure, which is surrounded by an increased thickness of the insulators 20 and 23 (see FIGS. 3A to 3C). This can further reduce an impact during the wire bonding and mitigate an influence of the impact on the circuit elements disposed below the pad electrodes PD.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device, comprising:
a circuit comprising a circuit element on a substrate;
interconnections above the circuit in a first direction and electrically connected to the circuit;
a pad electrode positioned above the interconnections in the first direction and having a metal wiring bonding region, the pad electrode being electrically connected to the interconnections;
a plurality of electrode layers between the circuit and the pad electrode in the first direction, the plurality of electrode layers being stacked on each other in the first direction from the circuit element to the interconnections;
a semiconductor pillar that extends in the first direction; and
a storage film between the plurality of electrode layers and the semiconductor pillar, wherein
the pad electrode is positioned above the circuit element in the first direction so as to overlap a position of the circuit element.

2. The memory device according to claim 1, further comprising:
a contact plug that extends in the first direction and electrically connects one of the interconnections to the circuit, wherein
the contact plug is between the one of the interconnections and the circuit in the first direction.

3. The memory device according to claim 2, further comprising:
an insulator between the pad electrode and the circuit and that has a thickness in the first direction greater than a length of the semiconductor pillar in the first direction, wherein
the contact plug penetrates the insulator in the first direction.

4. The memory device according to claim 2, further comprising:
a conductive layer between the circuit and the plurality of electrode layers and connected to the semiconductor pillar, wherein
the circuit includes an interconnection between the substrate and the conductive layer and is connected to the circuit element, and
the contact plug is electrically connected to the interconnection.

5. The memory device according to claim 2, further comprising:
a conductive layer between the circuit and the plurality of electrode layers and connected to the semiconductor pillar, wherein the contact plug penetrates the plurality of electrode layers and the conductive layer to extend in the first direction.

6. The memory device according to claim 1, further comprising:
an insulator between the pad electrode and the circuit and having a thickness in the first direction greater than a length of the semiconductor pillar in the first direction.

7. The memory device according to claim 1, further comprising:
a conductive layer between the circuit and the plurality of electrode layers and connected to the semiconductor pillar; and
a contact plug that penetrates the plurality of electrode layers with interlayer insulating films to extend in the first direction, and that is connected to the conductive layer, wherein
the contact plug is between the circuit and the pad electrode.

8. The memory device according to claim 1, wherein the pad electrode is above a region in the first direction that lacks semiconductor pillars.

9. The memory device according to claim 1, further comprising:
a semiconductor layer between the circuit and the plurality of electrode layers;
a contact plug that penetrates the plurality of electrode layers in the first direction and is connected to the semiconductor layer, wherein
the contact plug is between the circuit and the pad electrode,
an insulator is between the pad electrode and the circuit has a thickness in the first direction greater than a length of the contact plug in the first direction, and
the contact plug penetrates the insulator in the first direction.

10. The memory device according to claim 1, wherein a bonding wire is directly bonded to the metal wire bonding region of the pad electrode.

11. A memory device, comprising:
a circuit that includes a first circuit element on a substrate;
a peripheral circuit on the substrate;
an interconnection layer above a first part of the peripheral circuit and including a pad electrode having a region to which a metal bonding wire can be bonded;
a plurality of electrode layers above a second part of the peripheral circuit, the plurality of electrode layers being stacked in a first direction from a level of the peripheral circuit to a level of the interconnection layer;
a semiconductor pillar that extends in the first direction through the plurality of electrode layers; and
a storage film that is disposed between the plurality of electrode layers and the semiconductor pillar, wherein
the pad electrode overlaps the first circuit element as viewed in the first direction.

12. The memory device according to claim 11, wherein the peripheral circuit is a power supply circuit.

13. The memory device according to claim 11, further comprising:
an insulator between the pad electrode and the circuit and that has a thickness in the first direction that is greater than a length of the semiconductor pillar in the first direction, wherein
the contact plug penetrates the insulator in the first direction.

14. The memory device according to claim 11, further comprising:
a second pad electrode that overlaps a second circuit element as viewed in the first direction, wherein
the second circuit element is part of the peripheral circuit.

15. A memory device, comprising:
a drive circuit that including transistors on a substrate;
a contact plug contacting a transistor of the drive circuit;
a memory cell array above the drive circuit in a first direction and comprising a memory cell region and a contact region, the memory cell region comprising a plurality of electrode layers stacked in the first direction and the contact region comprising end portions of the plurality of electrode layers formed in a stair-stepped configuration;
a plurality of semiconductor pillars that penetrate the memory cell array in the first direction;
an interconnection layer above the memory cell array in the first direction and including interconnections; and
a pad electrode in the interconnection layer and having a metal wiring bonding region, wherein
the pad electrode overlaps the transistor as viewed in the first direction.

16. The memory device of claim 15, further comprising:
an insulator between the pad electrode and the drive circuit that has a thickness in the first direction that exceeds a length of the semiconductor pillars in the first direction.

17. The memory device of claim 15, wherein the pad electrode is above the memory cell region and the semiconductor pillars do not overlap the pad electrode as viewed in the first direction.

18. The memory device of claim 15, further comprising:
a first memory cell array and a second memory cell array stacked in the first direction, wherein
a first semiconductor pillar penetrates the first memory cell array and contacts a second semiconductor pillar that penetrates the second memory cell array.

19. The memory device of claim 18, further comprising:
an insulator between the pad electrode and the drive circuit that has a thickness in the first direction that exceeds the combined length of the first semiconductor pillar and the second semiconductor pillar in the first direction.

20. The memory device of claim 1, further comprising:
an insulator between the pad electrode and the circuit, wherein the insulator surrounds an outer edge of the pad electrode and a surface of the pad electrode is exposed from the insulator.

* * * * *